United States Patent
Thomas et al.

(10) Patent No.: US 8,421,802 B2
(45) Date of Patent: Apr. 16, 2013

(54) PEAK VISUALIZATION ENHANCEMENT DISPLAY SYSTEM FOR USE WITH A COMPRESSED WAVEFORM DISPLAY ON A NON-DESTRUCTIVE INSPECTION INSTRUMENT

(75) Inventors: Andrew R. Thomas, Westford, MA (US); Steven Besser, Framingham, MA (US); Daniel Kass, Attleboro, MA (US); Erich Henjes, Newton, MA (US); Ehab Ghabour, Northborough, MA (US); Marc Dulac, Dracut, MA (US); Paul J. DeAngelo, Bridgewater, MA (US)

(73) Assignee: Olympus NDT, Waltham, MA (US)

( * ) Notice: Subject to any disclaimer, the term of this patent is extended or adjusted under 35 U.S.C. 154(b) by 1076 days.

(21) Appl. No.: 12/399,670

(22) Filed: Mar. 6, 2009

(65) Prior Publication Data

US 2009/0225083 A1      Sep. 10, 2009

Related U.S. Application Data

(60) Provisional application No. 61/034,566, filed on Mar. 7, 2008.

(51) Int. Cl.
*G06T 11/20*  (2006.01)
*H03F 1/26*   (2006.01)
*H03M 1/00*   (2006.01)
*H04B 15/00*  (2006.01)

(52) U.S. Cl.
USPC ............... 345/440; 345/440.1; 345/440.2; 702/189; 341/132

(58) Field of Classification Search ............ 345/440, 345/440.1, 440.2; 341/126–132, 155–172; 702/189
See application file for complete search history.

(56) References Cited

U.S. PATENT DOCUMENTS

| | | | | |
|---|---|---|---|---|
| 3,471,853 A * | 10/1969 | McCullough et al. | ......... | 341/132 |
| 5,434,593 A * | 7/1995 | Lecklider et al. | ............. | 345/634 |
| 5,740,064 A * | 4/1998 | Witte et al. | ..................... | 702/70 |
| 6,487,787 B1 * | 12/2002 | Nahum et al. | .................. | 33/706 |
| 2002/0118191 A1 * | 8/2002 | Passi et al. | ..................... | 345/440 |
| 2003/0030862 A1 * | 2/2003 | Trier et al. | ..................... | 359/110 |
| 2006/0254359 A1 * | 11/2006 | Langlois et al. | ................ | 73/606 |
| 2007/0024622 A1 * | 2/2007 | Brauss | ........................... | 345/440 |

* cited by examiner

*Primary Examiner* — Ke Xiao
*Assistant Examiner* — Jed-Justin Imperial
(74) *Attorney, Agent, or Firm* — Ostrolenk Faber LLP (57) ABSTRACT

A peak visualization enhancement system for use with a non-destructive inspection (NDI) instrument using a digital display which replicates the haloing effect of analog cathode ray tube (CRT) displays. A peak detection algorithm is provided which intelligently selects the peak values from within the uncompressed digitized waveform while taking measures to prevent noise spikes and the like from being identified as valid waveform peaks. The digital display then highlights the identified peaks, or a subset of the identified peaks, on the compressed waveform display. In this way the effect of bright spots (halos) about the zero slope points on a waveform displayed on an analog CRT is replicated in a digitally compressed waveform display.

25 Claims, 11 Drawing Sheets

PEAK VISUALIZATION ENHANCEMENT DISPLAY SYSTEM FOR USE WITH A COMPRESSED WAVEFORM DISPLAY ON A NON-DESTRUCTIVE INSPECTION INSTRUMENT

CROSS REFERENCE TO RELATED APPLICATIONS

This application claims the benefit and priority of U.S. Provisional patent application Ser. No. 61/034,566, filed Mar. 7, 2008 entitled A PEAK VISUALIZATION ENHANCEMENT DISPLAY SYSTEM FOR USE WITH A COMPRESSED WAVEFORM DISPLAY ON A NON-DESTRUCTIVE INSPECTION INSTRUMENT, the entire disclosure of which is incorporated herein by reference.

BACKGROUND OF THE INVENTION

The present invention relates to non-destructive inspection (NDI) instruments, and more particularly to a peak visualization enhancement display system for said instruments which replicates the so-called haloing effect of analog cathode ray tube (CRT) displays.

Any discussion of the related art throughout this specification should in no way be considered as an admission that such art is widely known or forms a part of the common general knowledge in the field.

As digital signal processing methods and techniques have increased in power, speed, and availability in recent years, portable electronic systems which digitize and process data in real time have increased in popularity. This is especially true of the NDI industry. Many of the functions once handled by bulky, complex, and in some cases costly analog circuits are now performed completely, and in many cases more efficiently, within digital electronics such as digital signal processors or custom designed FPGAs. Such functions include, but are not limited to, filtering to shape and improve the quality of test waveforms, applying complex time varied gain curves to facilitate real time analysis of data, and automated analysis of test data. The advanced functions within NDI instrumentation provided by digital signal processing methods and techniques offer a practically countless array of improvements and benefits over more traditional analog systems.

One such improvement offered by digital systems is in waveform display. Digital systems can readily (in real time or within an acquire/playback architecture) compress large amounts of digital waveform data and plot it on a high resolution digital display module, such as an LCD or VGA display. In recent years such displays have reduced in cost and power consumption while offering an ever increasing image quality. Such displays have become ideal for use within NDI instrumentation, which typically requires that a detailed digitized waveform be displayed for an end user in real time and with a high frame rate—that is, the rate at which the waveform data is updated and refreshed.

While digital waveform displays, making use of intelligently compressed waveform data displayed at high resolution, offer significant improvements over prior art analog CRT displays, one aspect of analog CRT systems is lost in the move to digital display systems.

CRT display systems function by directing an electron beam, sometimes referred to as a cathode ray, through a vacuum tube and onto a phosphorus coated screen. This causes the phosphorus on the areas of the screen impacted by the electron beam to light up briefly. By directing the electron beam to move across the screen in a particular pattern, an image can be formed on the screen. In analog CRT waveform displays, as are common in older analog NDI instrument designs, this technique can be used to quite effectively draw an image of a waveform on a display screen.

One aspect of an analog CRT display system is the so-called haloing effect. As the electron beam moves horizontally across the phosphorus coated screen at a constant speed, it shifts vertically up and down to trace the desired waveform. At those points where the slope of the waveform is zero—that is, at those points where the electron beam switches from moving vertically up to vertically down or vise versa—the electron beam will pause briefly. This has the effect of hitting the phosphorus on the screen at these zero slope points with more electrons than other parts of the waveform. As a result, these zero slope points will tend to glow brighter than the rest of the waveform, haloing the peaks and valleys of the waveform.

This haloing effect is simply a side effect characteristic of the analog CRT display system. As the electron beam sweeps across the phosphorus coated screen to trace a waveform, its vertical velocity pauses (becomes zero) for a brief time at each zero slope point. This characteristic has become a useful feature within analog CRT display systems, in particular with analog NDI instruments. The haloing effect allows an end user to readily observe waveform peaks that would otherwise be lost within larger peaks. This is especially true of situations in which an NDI instrument is displaying a large range of data—that is, when the display is showing a very long waveform. In such cases, waveform peaks, which are of great interest to the inspection operation, are drawn very close together and often appear muddled together, indistinguishable from each other aside from the haloing effect.

As such, the haloing effect of analog CRT display systems has become an invaluable tool to a certain subset of very highly skilled NDI operators. Operators performing ultrasonic flaw detection inspections on nuclear vessel walls (the very thick walls used to shield nuclear reactors), for example, rely on the CRT haloing effect to observe flaws near or within the large backwall echo inherent to such an inspection. Similarly, operators performing intergranular stress corrosion cracking (IGSCC) inspections often encounter complex, so-called spindle cracks which propagate in multiple directions along the grain of a course material. The ultrasonic reflections from the multiple facets of spindle cracks have a tendency to conflate together, returning a tightly packed, irregular echo with multiple peaks. Taking advantage of the haloing effect, however, a skilled operator can accurately locate and size such a complex crack in a material under inspection.

As the haloing effect does not exist in digital displays, many operators who rely on it are reluctant or unable to use the more advanced NDI instruments offered in the marketplace today. This prevents such operators from benefiting from the many advantages of digital NDI systems and limits the effectiveness and accuracy of their inspection operations. Some attempts have been made to mimic the haloing effect in digital NDI instruments (most notably the so-called "Sparkle" feature offered in some portable instruments offered by GE Inspection Technologies, located in Billerica, Mass.) by simply highlighting the maximum value of each compression zone, but this technique is lacking. It does not accurately represent peak values in highly compressed data, and it does not preserve peak information when multiple peaks are displayed in very close vicinity on a display.

Accordingly, it would be advantageous to provide a digital display system that replicated the haloing effect of analog CRT display systems. Further it would be advantageous if this digital display system accurately displayed peak values within highly compressed data. It would also be advantageous if this digital display system preserved all peak information, regardless of range and compression ratio settings. It would further be advantageous if the display system offered controls or measures to prevent the detection and display of so-called false peaks caused by noise spikes and the like within the waveform without sacrificing any resolution in the digitized waveform.

SUMMARY OF THE DISCLOSURE

It is the object of the present disclosure to overcome the problems associated with prior art. This is attained by introducing the Peak Visualization Enhancement (PVE) system of the present disclosure. The PVE system of the present disclosure makes use of a peak detection algorithm which is run in parallel with a standard data compression algorithm within an NDI instrument. Standard compression algorithms, which should be well known to those skilled in the art, typically divide a digitized waveform into a plurality of compression zones, each compression zone comprised of a set of points. Each compression zone, and thus each set of points, is represented on the display by a vertical line drawn from the minimum value of the set of points to the maximum value of the set. The values used to draw these vertical lines on a digital waveform display are sometimes referred to as min/max pairs.

The PVE peak detection algorithm (outlined in detail within the flowchart of FIG. 5) identifies the peak values within a digitized waveform, allowing the peaks within each compression zone to be highlighted on the vertical line. In this way, peak information within each compression zone is preserved, regardless of how many points are within each compression zone (that is, regardless of the compression ratio). A display assembly module combines the peak data provided by the PVE peak detection algorithm with the min/max pairs of the standard compression algorithm, and provides a digital representation of the waveform which closely replicates the haloing effect of analog CRT displays and is suitable for display on a digital NDI instrument.

Figure 5:
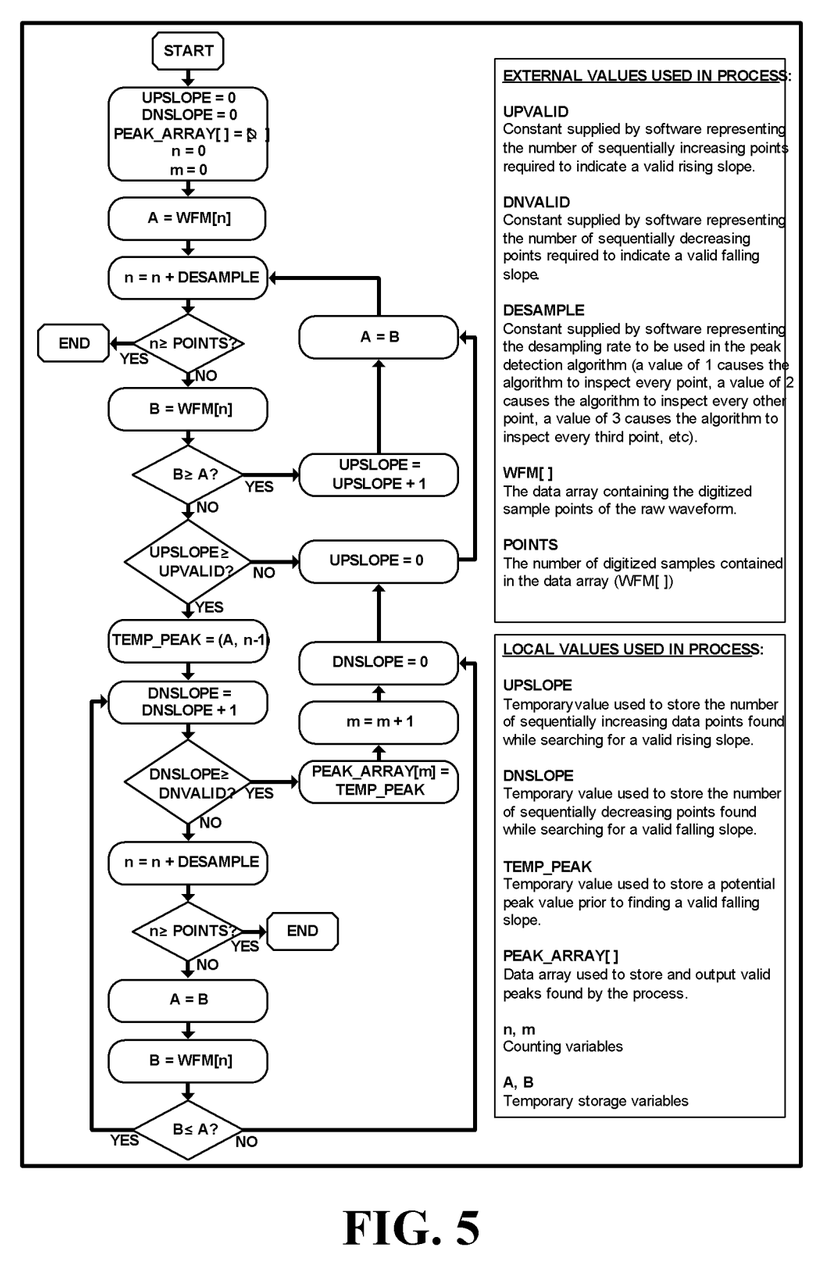
FIG. 5 is a flowchart detailing the Peak Visualization Enhancement peak detection algorithm.

Controls are provided within the algorithm to prevent noise spikes and the like from becoming displayed as false peaks on the digitally displayed waveform. These include minimum values for determining valid waveform slopes around apparent zero slope points and a desample control, which allows the PVE peak detection algorithm to decimate the raw waveform data by a set factor during peak detection. These controls are shown in FIG. 5 and described in detail in the Detailed Description section of the present disclosure.

In one embodiment of the present disclosure, uncompressed waveform data is passed through a digital filter prior to the PVE peak detection algorithm. This filter can be used to reduce the noise level of the uncompressed waveform prior to its analysis within the PVE algorithm without affecting the waveform as displayed. In certain applications, the use of a filter in this way can significantly reduce the likelihood of a noise spike or the like resulting in a false peak.

In the preferred embodiment of the present disclosure, the PVE display system is used within a so-called acquire/playback system. That is, a measurement waveform is fully acquired, digitized, and stored in a temporary memory space in a first operation. In a second operation the digitized waveform is played back from the temporary memory space, processed through any number of DSP algorithms (digital filtering, time varied gain, digital compression, and the like), and displayed to an operator on a digital display. In state of the art NDI instruments, both these operations can be completed within a desired repetition rate (that is, the number of waveforms acquired per second), allowing an acquire/playback system to provide real time, processed waveform data to a digital display. Within this type of system, the PVE algorithm can be run continuously on the entire digitized waveform, ensuring that no peak information is missed.

Figure 11A:
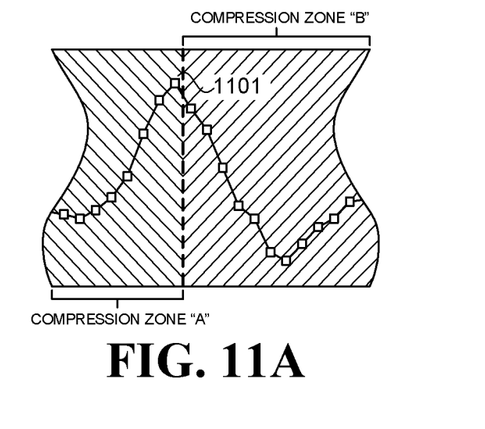
FIGS. 11A-11B are illustrations depicting the compression overlap technique required when the Peak Visualization Enhancement system of the present disclosure is used within a so-called compress on the fly system.
Figure 11B:
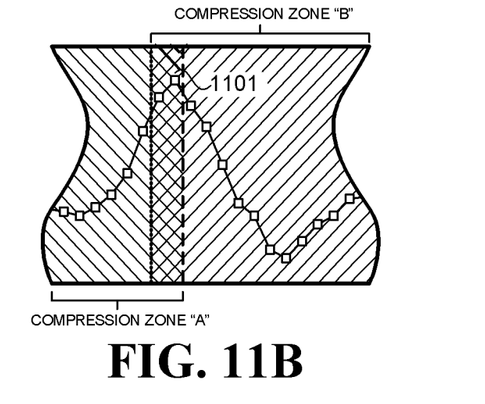

Conversely, many digital NDI instruments make use of a so-called compress on the fly technique, which requires that digitized waveform data be compressed into min/max pairs as it is being acquired. That is, data in each compression zone must be compressed without the benefit of looking ahead to the next set of points. When used in this type of system, the PVE algorithm will require an overlap compression technique, whereby each compression zone includes a number of points from the previous compression zone, to prevent the loss of any peak information. This overlap compression technique is illustrated in FIGS. 11A and 11B and discussed in detail in the Detailed Description section of the present disclosure.

The peak highlighting used on the PVE compressed waveform display can take a plurality of forms. In the preferred embodiment of the present disclosure, the peaks are highlighted by using a significantly lighter shade of the color used to draw the vertical lines of the compressed waveform to draw the peak points. In this way, the haloing effect of an analog CRT display is most closely replicated, providing the operator with a familiar interface. In another embodiment, the peak highlighting is accomplished by using a first color for the peak values and a second color for the vertical lines. In yet another embodiment, the peaks within a PVE compressed waveform can be color coded—that is, a first color assigned for the largest peak within a compression zone, a second color assigned for the next largest, and so on.

In yet another embodiment, markers, such as solid squares, are used to mark each peak on a vertical line. This highlighting method has been used in the figures of the present disclosure, as it provides the clearest view of the methods of the present disclosure within the limitations of black and white drawings. The exclusive use of said highlighting method within the figures of the present disclosure has been done for the benefit of clarity of illustration. This exclusive use should in no way be interpreted as the only suggested peak highlighting method or even the preferred method of peak highlighting.

In the preferred embodiment of the present disclosure, all of the peak values identified by the PVE peak detection algorithm are highlighted and included on the displayed waveform. However, the methods of the present disclosure are not limited in this regard. The PVE system can be optimized, as dictated by the specific application, to highlight only a certain number of the identified peaks. For example, one embodiment of the present disclosure only highlights the maximum peak and the minimum peak within each compression zone. In another embodiment, the first three highest peaks in each compression zone are highlighted along with the lowest two. In this way, the DSP resources used to realize the PVE system in an NDI instrument can be optimized for the specific application.

Accordingly it is the object of the present disclosure to provide a Peak Visualization Enhancement (PVE) system for use with an NDI instrument which replicates the haloing effect of an analog CRT display.

It is also an object of the present disclosure that this PVE system make use of an algorithm which identifies all of the valid peaks within a digitized waveform.

It is further an object of the present disclosure that this algorithm include valid slope identification and desampling controls such that the possibility of identifying a noise spike or the like as a valid peak is reduced.

It is also the object of the present disclosure that the identified peaks, or a subset of said identified peaks, are highlighted in some manner which distinguishes them in some way from the rest of the compressed waveform on the digital display of the NDI instrument. Said method of highlighting including, but not limited to, a brighter shade of the color used to draw the compressed waveform, a plurality of different colors used to differentiate the peaks from each other, and a marker symbol such as, but not limited to, a solid square or circle.

Other features and advantages of the present disclosure will become apparent from the following description of the invention that refers to the accompanying drawings.

DETAILED DESCRIPTION

Figure 1:
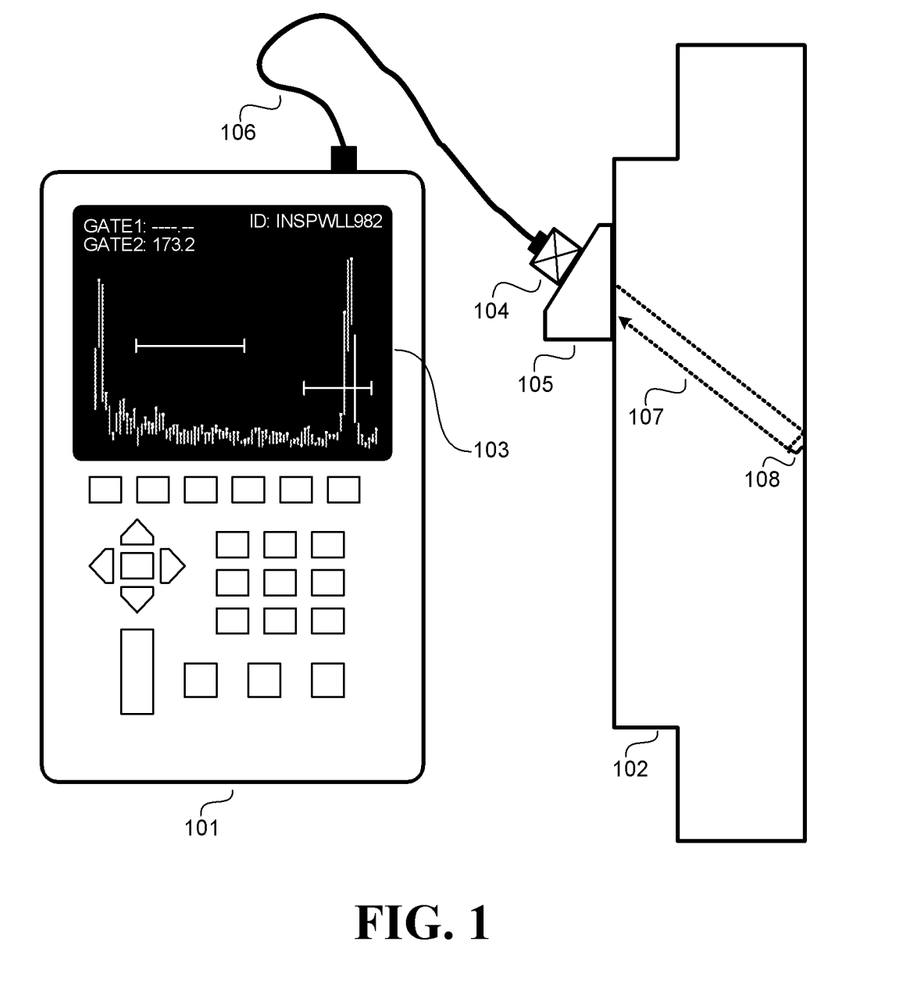
FIG. 1 is an illustration depicting a typical NDI instrument making use of the Peak Visualization Enhancement system of the present disclosure.

FIG. 1 illustrates a typical non-destructive inspection (NDI) instrument 101, specifically an ultrasonic flaw detector, using the Peak Visualization Enhancement (PVE) system of the present disclosure to inspect a flaw 108 within an object under inspection 102. The details and methods of flaw detection with such an instrument should be well known to those skilled in the art, but are presented in brief herein for reference.

The transducer element 104 is acoustically coupled to a wedge element 105 which is, in turn, acoustically coupled to the object under inspection 102. The ultrasonic flaw detector 101 excites transducer element 104 through transducer cable 106. Responsive to said excitation, the transducer element 104 emits an ultrasonic pulse which propagates through the wedge element 105. The wedge element 105 further transmits said ultrasonic pulse into the object under inspection 102 at a particular angle, said angle selected to meet the needs of the inspection operation. The ultrasonic pulse then travels along a sound path 107 through the object under inspection 102, is reflected by the back wall and then further reflected by the defect 108 such that an acoustic echo is received by the transducer element 104 through the wedge element 105. The transducer element 104 converts the reflected acoustic energy into an electrical signal and transmits said signal to the ultrasonic flaw detector 101 through transducer cable 106. The ultrasonic flaw detector then digitizes and processes said electrical signal, providing inspection data to the display 103. The waveform presented on the display 103 represents acoustic energy received by the transducer element 104 over time, which is directly proportional to the distance traveled along the acoustic path 107. In fact, the x-axis of the display 103 is typically mapped to distance by using the speed of sound through the object under inspection 102 (a constant found through an instrument calibration procedure) as a linear transform.

Figure 2A:
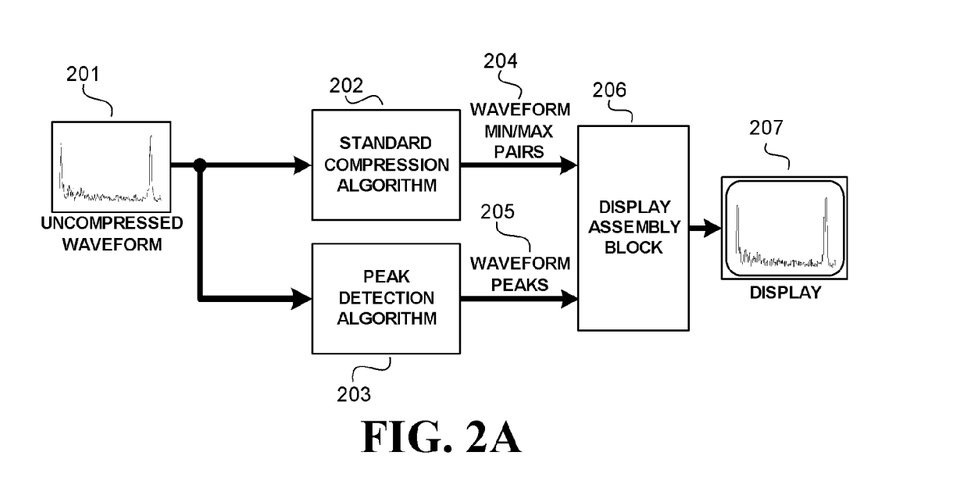
FIG. 2A is a block diagram illustrating the preferred embodiment of the Peak Visualization Enhancement system of the present disclosure.

FIG. 2A illustrates a block diagram of the preferred embodiment of the PVE system of the present disclosure. The uncompressed waveform 201 is provided in parallel to both the standard compression algorithm block 202 and the peak detection algorithm block 203. It is assumed at this point that all other digital signal processing algorithms and analysis (such as, but not limited to, digital filtering, time varied gain adjustment, and gate detections) have been previously performed on the acquired waveform data, and that the uncompressed waveform 201 is ready for compression and display.

The standard compression algorithm 202 should be well known to those skilled in the art. The data points of the uncompressed waveform are divided into a plurality of compression zones, each comprising a set of data points from the uncompressed waveform 201. In some compression algorithms—so-called compress on the fly algorithms—these compression zones overlap such that those points near a boundary of two compression zones are included in both. Each compression zone is then represented by a so-called min/max pair. That is, the maximum value and the minimum value within the set of data points which comprise each compression zone are provided such that an array of min/max pairs 204 is presented to the display assembly block 206. In this way the entirety of the uncompressed waveform is represented as a set of vertical lines, each of said vertical lines representing the vertical bounds of a single corresponding compression zone. Again, the methods of this and other standard compression algorithms are well known to those skilled in the art, and not specific to the methods of the present disclosure.

The peak detection algorithm block 203 processes the uncompressed waveform 201 in parallel with the standard compression algorithm block 202 and provides a set of waveform peaks 205 to the display assembly block. The peak detection algorithm is illustrated in the form of a flowchart in FIG. 5 and discussed in detail below.

The display assembly block 206, responsive to both the set of waveform peaks 205 provided by the PVE algorithm block 203 and the set of waveform min/max pairs 204 provided by the standard compression algorithm block 202, assembles both sets into a single waveform image. Each min/max pair 204 is drawn as a vertical line representing the vertical bounds of its corresponding compression zone, and peaks falling within that same compression zone are highlighted on said vertical line.

In the preferred embodiment of the present disclosure, all of the identified peaks falling within each compression zone are highlighted. However, the present disclosure is not limited in this regard. Other embodiments of the present disclosure, wherein only a specifically chosen subset of the waveform peaks falling within each compression zone is highlighted, are also contemplated. For example, an embodiment of the present disclosure wherein the PVE system highlights only the highest and second highest peak within each compression zone may be sufficient for a given application, and such an embodiment may provide a more efficient use of digital signal processing resources for said application. An embodiment wherein a user is allowed to select from a bank of display modes, including modes which display various subsets of peaks and a mode which displays all peaks, is also contemplated.

In the preferred embodiment of the present disclosure, peak highlighting is accomplished by using a significantly lighter shade of the color used to draw the vertical lines of the standard compression algorithm to draw each of the peak locations. In another embodiment of the present disclosure, a plurality of colors can be used to differentiate each peak value from the lines representing the vertical bounds of each compression zone as well as the other peaks within each compression zone. For example, a first color can be used to draw the vertical line of the compression zone, a second color used to highlight the highest peak, and third color used to highlight the second highest peak. In yet another embodiment, marker symbols—such as, but not limited to, solid squares or circles—can be used to highlight the peak values.

It should be noted that while a plurality of highlighting methods have been suggested herein, the PVE system of the present disclosure is not limited in this regard. Indeed, any method of distinguishing waveform peak values 205 from the standard min/max pair values 204 on the compressed waveform display 207 are sufficient for the methods of the present disclosure. Further, the specific highlighting method used on the display is not specific to the PVE system of the present disclosure.

Figure 2B:
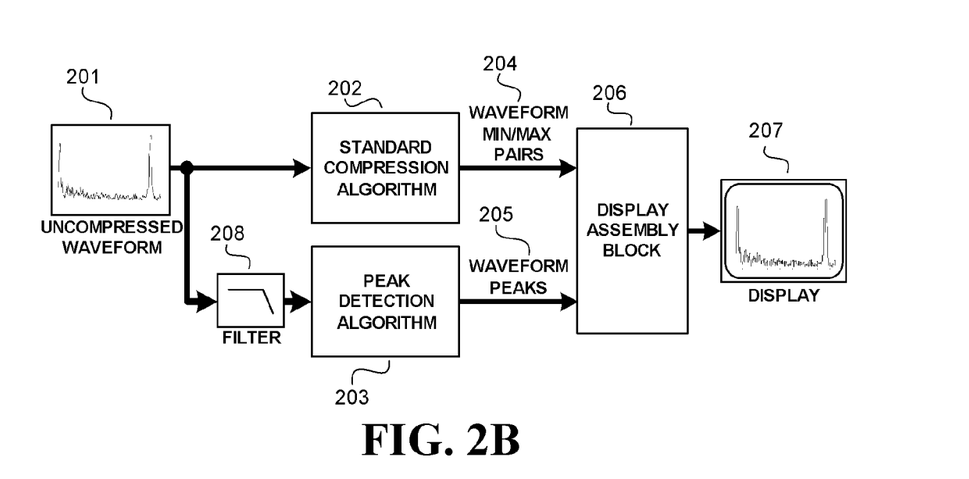
FIG. 2B is a block diagram illustrating an alternate embodiment of the Peak Visualization Enhancement system of the present disclosure which includes a digital filter used to reduce noise within the digitized waveform prior to peak detection.

FIG. 2B illustrates an alternate embodiment of the present disclosure wherein a filter 208 is used to reduce noise and the like from the uncompressed waveform 201 before it is processed through the peak detection algorithm block 203. In certain applications, this noise reduction step can significantly reduce the identification of so-called false peaks—that is, peaks which represent noise spikes and the like as opposed to valid echo peaks.

Figure 3:
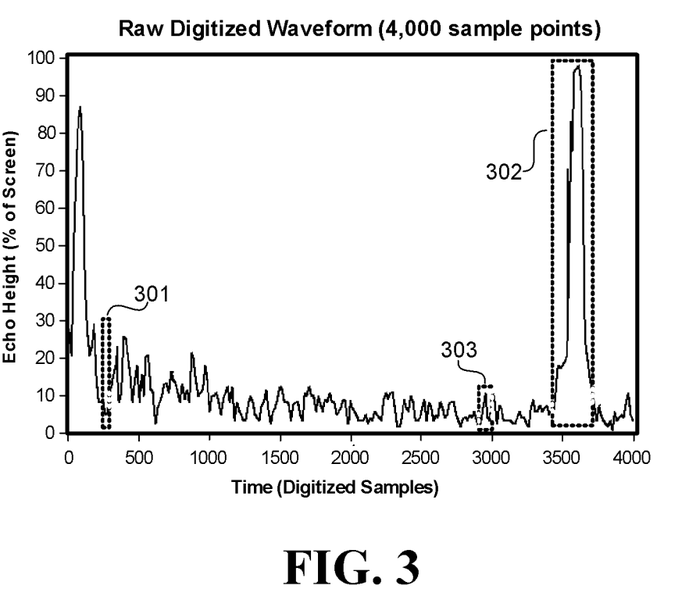
FIG. 3 is a waveform plot depicting a typical uncompressed digitized waveform which is used to demonstrate the methods of the Peak Visualization Enhancement system of the present disclosure.

FIG. 3 is a waveform plot of an uncompressed waveform, shown at full range, suitable for display compression using the PVE system of the present disclosure. Regions of the uncompressed waveform shown in FIG. 3 will be used in subsequent figures (on an expanded scale) to demonstrate the methods of the present disclosure. Region 301 is redrawn in FIG. 4 (as item 401) and used to illustrate the methods of the present disclosure on a single compression zone. Region 302 is redrawn in FIG. 6 to offer a clear view of the echo peaks 601, 602, 603, and 604 located near and within the backwall echo of the uncompressed waveform. These echo peaks will be used to demonstrate the merits of the PVE system of the present disclosure. Finally, region 303 is redrawn in FIG. 10 and is used to illustrate a compression zone which contains both a valid peak 1002 and a noise spike 1001.

The entirety of the uncompressed waveform has been included in FIG. 3 to serve as a reference for those zoomed regions as well as to provide a comparison to the full range compressed waveforms in FIGS. 7A, 7B, 8A, 8B, 9A, and 9B.

Figure 4:
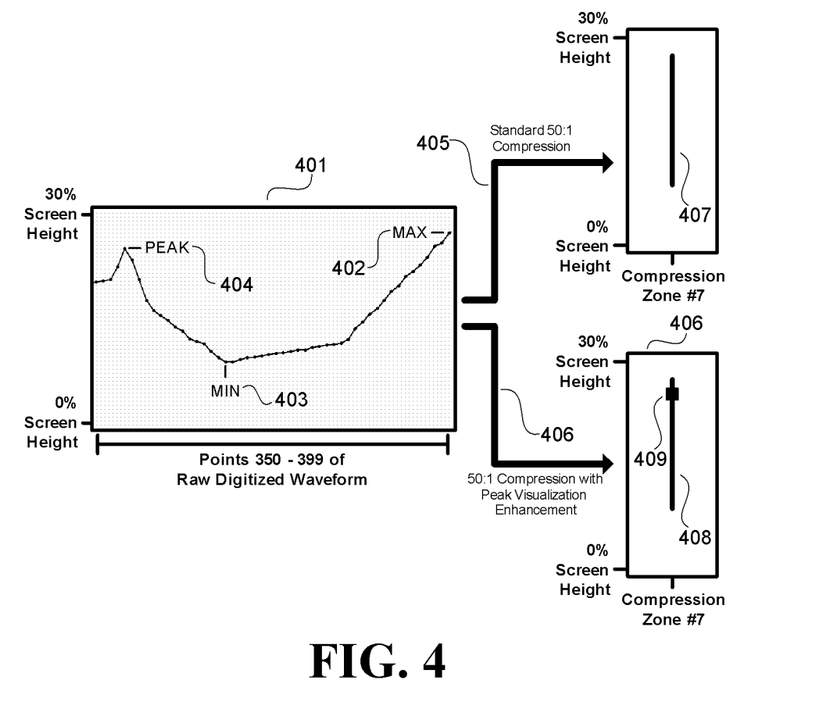
FIG. 4 is an illustration highlighting the benefits of the Peak Visualization Enhancement system of the present disclosure over a standard compression algorithm when compressing a region of the uncompressed digitized waveform of FIG. 3.

FIG. 4 illustrates the methods of the PVE system of the present disclosure on a single compression zone. For this exemplary compression zone, a compression ratio of 50:1 has been selected. That is, the acquired waveform has been divided into sets of 50 points, and in the final display waveform each vertical line will represent 50 acquired samples of that original waveform. More specifically, compression zone #7 (uncompressed waveform points 350 through 399) is shown.

Observing the compression zone on an expanded scale, it is readily apparent that this set of points contains a maximum value 402, a minimum value 403, and a single echo peak 404. It should be noted that the maximum value 402 is not, in fact, a valid peak. As previously discussed, a standard compression algorithm (represented by the upper path 405) would represent this group of 50 points as a vertical line 407 starting at the minimum value of the set 403 and ending at the maximum value of the set 402. Using such a method, the echo peak 404 is obscured.

However, if the compression zone is compressed using the PVE system of the present disclosure (represented by the lower path 406), no valuable information is lost. As in the standard compression algorithm, a vertical line 408 representing the vertical bounds of the compression zone is drawn starting at the minimum value 403 and ending at the maximum value 402. The echo peak value 404, found by processing the waveform data through the PVE peak detection algorithm, is highlighted using a marker 409. In this way, the echo peak information is displayed, just as it would have been on an analog CRT display.

FIG. 5 depicts a flow chart which documents the preferred embodiment of the PVE peak detection algorithm. Using this algorithm, or an obvious equivalent, valid peaks within an uncompressed waveform can be identified and later highlighted on the compressed waveform display.

A plurality of external variables is provided to the PVE peak detection algorithm. UPVALID and DNVALID are constants supplied by software which determine the number of sequentially increasing or decreasing points, respectively, required to indicate a valid rising or falling slope, respectively.

DESAMPLE is a constant supplied by software representing the desampling rate to be used within the PVE peak detection algorithm. For example, a DESAMPLE value of one would cause the PVE peak detection algorithm to consider every point of the uncompressed waveform as a possible peak. A DESAMPLE value of two would cause the PVE peak detection algorithm to consider every second point—effectively ignoring all of the odd points and reducing the effective sampling rate of the waveform data processed by the PVE peak detection algorithm by 50%.

The UPVALID, DNVALID, and DESAMPLE variables provide the PVE peak detection algorithm with measures to eliminate or otherwise significantly limit the number of false peak identifications cause by noise spikes and the like. The use of these variables is demonstrated in detail in FIG. 10 and discussed in detail below.

WFM[ ] is an array of digitized sample points representing the uncompressed waveform data being analyzed by the PVE peak detection algorithm. In the preferred embodiment, WFM[ ] represents the entirety of the acquired waveform. In other embodiments wherein the PVE system of the present disclosure is used within a compress on the fly system, WFM[ ] represents the set of data points contained within the current compression zone. As previously discussed, in such a system said compression zones would overlap one another.

POINTS is a constant variable representing the number of points within the array WFM[ ].

In addition to the external variables, the PVE peak detection algorithm uses a plurality of internal variables. UPSLOPE and DNSLOPE are temporary variables used to store the number of sequentially increasing or decreasing points, respectively, within the WFM[ ] array.

TEMP_PEAK is a temporary variable used to store a potential peak value while the algorithm searches for a valid falling (decreasing) slope.

A and B are temporary storage variables used as registers to store and compare the data points pulled from the WFM[ ] array. Two counting variables n and m are also supplied, to keep track of the algorithm's place within the WFM[ ] array and the number of peaks found, respectively.

Finally, PEAK_ARRAY[ ] is an array variable which stores the valid peaks (both the height of each peak and each peak's location within the WFM[ ] array) that have been found within the WFM[ ] array. This variable serves as the output to PVE peak detection algorithm.

At the start of the algorithm the internal variables UPSLOPE, DNSLOPE, n, and m are set to 0, and the PEAK_ARRAY[ ] array variable is cleared.

Next, the first pair of waveform values is loaded. The first data point (WFM[n], n=0) is stored in variable A, n is incremented by the value of DESAMPLE, a check is made to ensure that the end of the WFM[ ] array has not been reached, and finally the second data point (WFM[n], n=DESAMPLE) is loaded into variable B.

The first two points are then compared to check for a rising slope (i.e., that the value stored in variable B is greater than the value stored in variable A). If the check is successful, the value of UPSLOPE is increased by 1. The data point stored in variable B is then transferred to A, n is again incremented by DESAMPLE, a check is made to ensure the algorithm has not reached the end of the WFM[ ] array, and then the next data point is loaded into variable B and the next comparison made. This loop continues until a decreasing value is found (i.e., until the check for a rising slope fails), indicating the potential first point within a valid down slope.

When the rising slope check is eventually unsuccessful, the value stored within UPSLOPE is compared against the software supplied UPVALID. If UPSLOPE is found to be less than UPVALID—that is, if a valid number of sequentially increasing points has not been found—UPSLOPE is reset to 0, the value in variable B is stored in variable A, and the search for a valid rising slope is started anew.

If, however, UPSLOPE is found to be greater than or equal to UPVALID—that is, if a valid number of sequentially increasing points has been found—the value stored within variable A (the last data value in a valid rising slope) and its position within the WFM[ ] array (n−1) is stored in the variable TEMP_PEAK, and DNSLOPE is increased by 1 (the value stored in B represents the first decreasing value).

The value stored within DNSLOPE is than compared against the software supplied DNVALID. If DNSLOPE is greater than or equal to DNVALID—that is, if a valid number of sequentially decreasing points has been found—the peak information stored within TEMP_PEAK (both the peak's location within WFM[ ] and its value) is loaded into PEAK_ARRAY[ ].

If, however, DNSLOPE is less than DNVALID—that is, if a valid number of sequentially decreasing points has not been found—n is incremented by DESAMPLE, a check is made to ensure the end of the WFM[ ] array has not been reached, the value in variable B is loaded into variable A, and the next value in the WFM[ ] array is loaded into B.

The values loaded in variables A and B—which represent the previous and next values in the WFM[ ] array, respectively—are compared to check for a decreasing slope. If the value stored within variable B is greater than the value stored within variable A—that is, if a decreasing slope was not found—the potential peak value stored in TEMP_PEAK is considered an invalid peak, DNSLOPE and UPSLOPE are both reset to 0, the value in variable B is stored in variable A, and the search for a valid rising slope started anew.

If however, the valued stored within variable B is less than or equal to the value stored within variable A—that is, if a decreasing slope was found—DNSLOPE is increased by one, and DNSLOPE is again compared against DNVALID to check if a valid number of sequential decreasing points has been found. This loop continues until either a valid falling slope is found (indicating a valid peak has been found) or an increasing value is found (indicating that a valid falling slope is absent and the peak information stored in TEMP_PEAK is invalid).

The algorithm ends when n is set to a value higher than the number of digitized points stored in the WFM[ ] array (a value stored within the software supplied variable POINTS). At that point, PEAK_ARRAY[ ] is provided to the display assembly block (206 in FIG. 2A) and the PVE compressed waveform can be drawn.

Although FIG. 5 has been drawn to present a flow chart representation of the PVE peak detection algorithm of the present disclosure in the most accessible and clearest terms, the present disclosure should not be limited in this regard. It should be readily recognizable to those skilled in the art that the algorithm, as presented in FIG. 5, could be realized through a number of obvious variations and implementations. As such, the flow chart representation of the PVE peak detection algorithm (as illustrated in FIG. 5) should be sufficient to represent any of these obvious variations or implementations of the presented algorithm.

Figure 6:
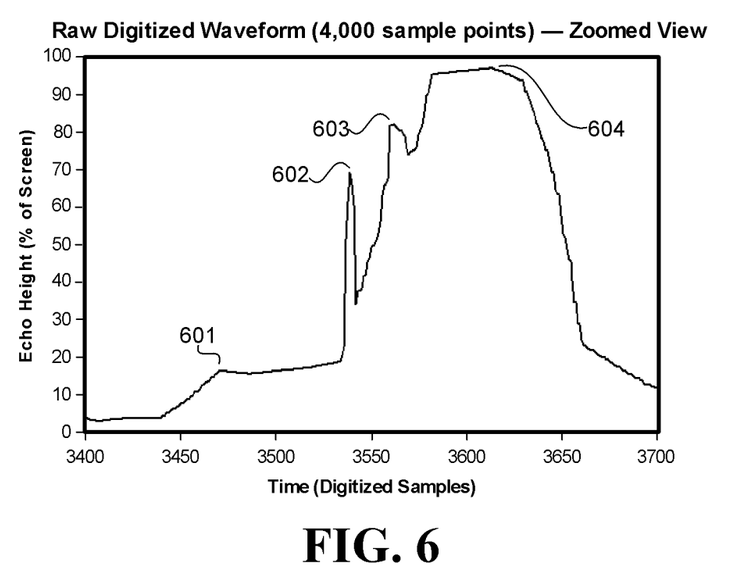
FIG. 6 is a waveform graph detailing a region of the uncompressed digitized waveform of FIG. 3 which includes the backwall echo.

FIG. 6 is a zoomed view of region 302 of the digitized waveform shown in FIG. 3. This set of 300 uncompressed waveform points, shown in greater detail due to the expanded scale, contains four peak values (601, 602, 603, and 604) which will be used to illustrate the merits of the PVE system of the present disclosure over increasingly high rates of compression in the subsequent FIGS. 7A, 7B, 8A, 8B, 9A, and 9B.

Figure 7A:
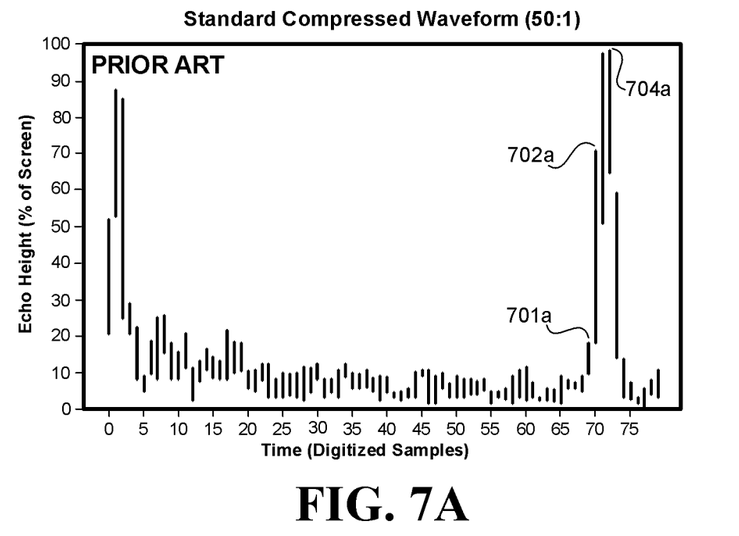
FIG. 7A is a waveform graph depicting the uncompressed digitized waveform of FIG. 3 compressed 50 to 1 using a standard compression algorithm.
Figure 7B:
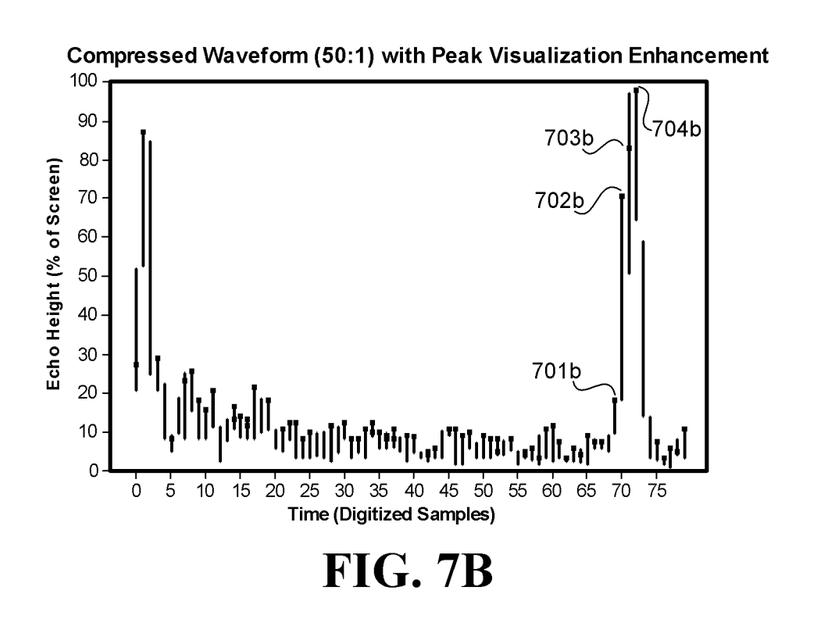
FIG. 7B is a waveform graph depicting the uncompressed digitized waveform of FIG. 3 compressed 50 to 1 using the Peak Visualization Enhancement system of the present disclosure.

FIGS. 7A and 7B depict plots of the digitized waveform shown in FIG. 3 compressed at a compression ratio of 50:1— that is, each compression zone (i.e., each vertical line) represents 50 points of the uncompressed waveform. FIG. 7A has been compressed using a standard, prior art compression algorithm, turning the 4,000 data points of the uncompressed waveform into 80 vertical lines. The first echo peak (601 in FIG. 6) has been successfully captured within compression zone 69, and is properly represented by the peak of that line 701a. Similarly, the second and fourth echo peaks (602 and 604 in FIG. 6) have been successfully captured within compression zones 70 and 72, respectively, and are properly represented by the peaks of those lines 702a and 704a, respectively. The third echo (603 in FIG. 6), however has been obscured within compression zone 71.

FIG. 7B has been compressed using the PVE system of the present disclosure. It should be noted that the set of 80 vertical lines representing the 4,000 uncompressed waveform points are identical to those in FIG. 7A (a waveform representation compressed using the standard compression algorithm). However, the echo peaks within each compression zone have been highlighted with solid square markers. All echo peaks—including, notably, the third echo peak (603 in FIG. 6) which was obscured in the standard compression algorithm—are easily identifiable within the PVE compressed waveform by highlighted points 701b, 702b, 703b, and 704b.

Figure 8A:
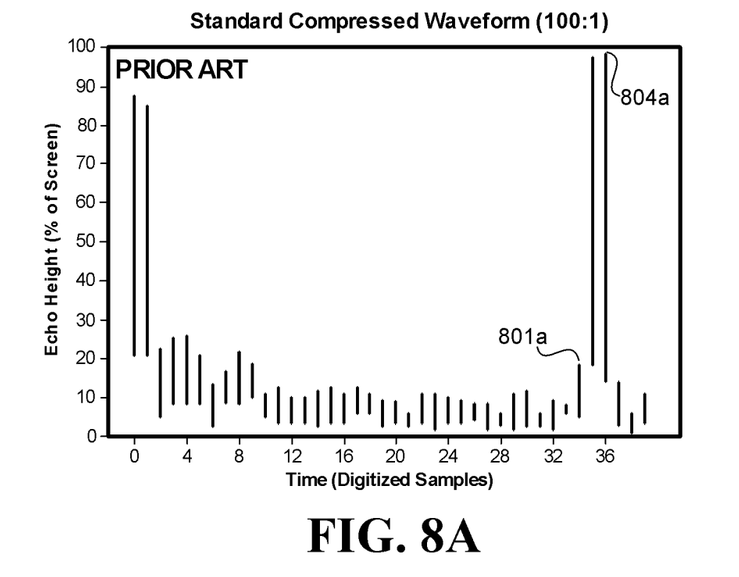
FIG. 8A is a waveform graph depicting the uncompressed digitized waveform of FIG. 3 compressed 100 to 1 using a standard compression algorithm.
Figure 8B:
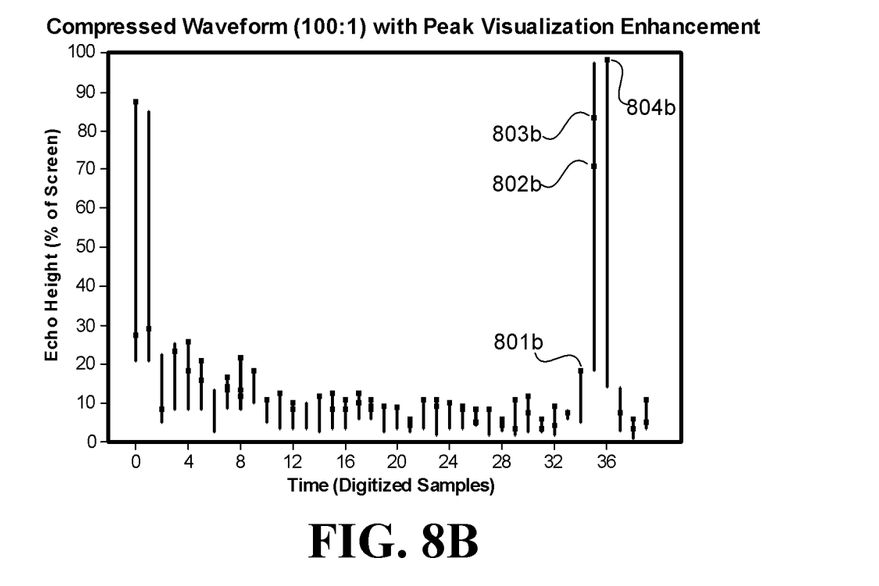
FIG. 8B is a waveform graph depicting the uncompressed digitized waveform of FIG. 3 compressed 100 to 1 using the Peak Visualization Enhancement system of the present disclosure.

FIGS. 8A and 8B depict plots of the digitized waveform shown in FIG. 3 compressed at a compression ratio of 100:1—that is, each compression zone (i.e., each vertical line) represents 100 points of the uncompressed waveform. FIG. 8A has been compressed using a standard, prior art compression algorithm, turning the 4,000 data points of the uncompressed waveform into 40 vertical lines. The first and fourth echo peaks (601 and 604 in FIG. 6) have been successfully captured within compression zones 34 and 36, respectively, and are properly represented by the peak of those lines 801a and 804a, respectively. The second and third echo peaks (602 and 603 in FIG. 6), however, have been obscured within compression zone 35.

FIG. 8B has been compressed using the PVE system of the present disclosure. It should be noted that the set of 40 vertical lines representing the 4,000 uncompressed waveform points are identical to those in FIG. 8A (a waveform representation compressed using the standard compression algorithm). However, the echo peaks within each compression zone have been highlighted with solid square markers. All echo peaks—including, notably, the second and third echo peaks (602 and 603 in FIG. 6) which were obscured in the standard compression algorithm—are easily identifiable within the PVE compressed waveform by highlighted points 801b, 802b, 803b, and 804b.

Figure 9A:
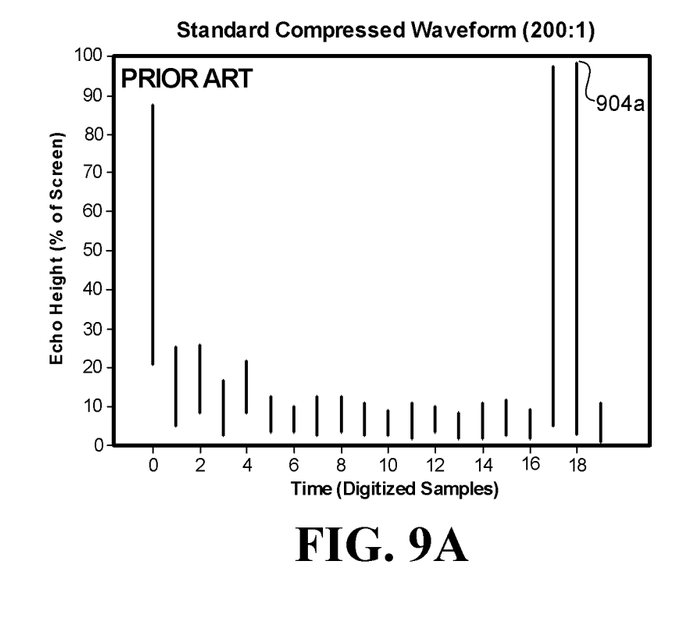
FIG. 9A is a waveform graph depicting the uncompressed digitized waveform of FIG. 3 compressed 200 to 1 using a standard compression algorithm.
Figure 9B:
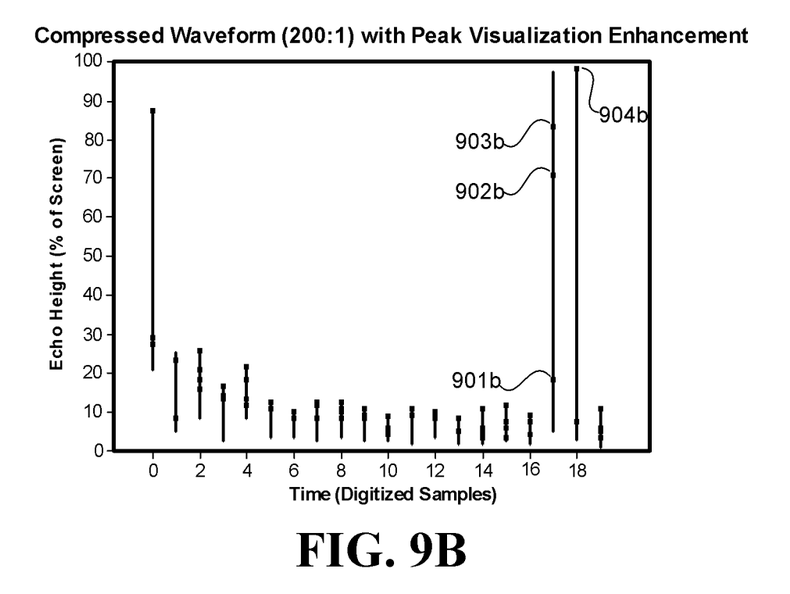
FIG. 9B is a waveform graph depicting the uncompressed digitized waveform of FIG. 3 compressed 200 to 1 using the Peak Visualization Enhancement system of the present disclosure.

FIGS. 9A and 9B depict plots of the digitized waveform shown in FIG. 3 compressed at a compression ratio of 200:1—that is, each compression zone (i.e., each vertical line) represents 200 points of the uncompressed waveform. FIG. 9A has been compressed using a standard, prior art compression algorithm, turning the 4,000 data points of the uncompressed waveform into 20 vertical lines. The fourth echo peak (604 in FIG. 6) has been successfully captured within compression zone 18 and is properly represented by the peak of that line 904a. The first, second, and third echo peaks (601, 602, and 603 in FIG. 6), however, have been obscured within compression zone 17.

FIG. 9B has been compressed using the PVE system of the present disclosure. It should be noted that the set of 20 vertical lines representing the 4,000 uncompressed waveform points are identical to those in FIG. 9A (a waveform representation compressed using the standard compression algorithm). However, the echo peaks within each compression zone have been highlighted with solid square markers. All echo peaks—including, notably, the first, second, and third echo peaks (601, 602, and 603 in FIG. 6) which were obscured in the standard compression algorithm—are easily identifiable within the PVE compressed waveform by highlighted points 901b, 902b, 903b, and 904b.

Figure 10:
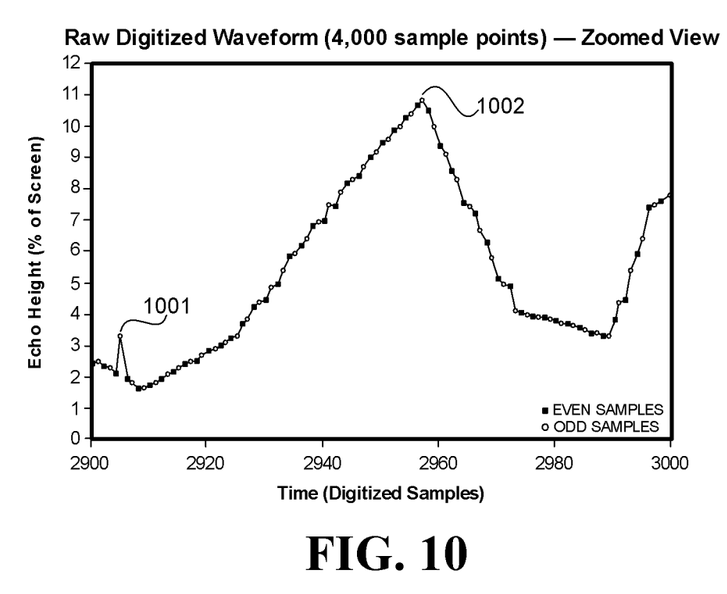
FIG. 10 is a waveform graph detailing a region of the uncompressed digitized waveform of FIG. 3 which includes the contains both a valid peak and a noise spike.

FIG. 10 is a graph depicting region 303 of the digitized waveform shown in FIG. 3. This region represents a single compression zone containing 100 points. Within this compression zone, there exists one noise spike 1001 and one valid echo peak 1002. Ideally, the PVE system of the present disclosure should ignore the noise spike 1001 and highlight the valid echo peak 1002. Using the UPVALID, DNVALID, and DESAMPLE controls (detailed in the discussion of FIG. 5 above), the PVE system of the present disclosure is well suited to properly characterize and display this compression zone.

In one example, the UPVALID variable could be set to a value of two. In that case, data point 2,905 of the uncompressed waveform would be identified as the first in a sequence of rising values and then dismissed when data point 2,906 was found to be a decreasing value. Similarly, DNVALID could be set to four to achieve the same result. In both cases, the algorithm would find sufficiently long rising and falling slopes about data point 2,957, allowing the PVE peak detection algorithm to recognize the valid echo peak 1002.

In another example, the DESAMPLE variable could be set to two. This would force the PVE peak detection algorithm to ignore all of the odd samples in the digitized waveform. To more easily illustrate this, the even points plotted in FIG. 10 have been marked with solid squares and the odd points marked with open circles. In this case, setting the DESAMPLE variable to a value of two would result in data point 2,905 being ignored by the PVE peak detection algorithm and not considered as a valid peak. The valid echo peak 1002, in this case, would be marked one data point early (data point 2,956 instead of data point 2,957), but would still be identified and highlighted within the PVE compressed waveform.

One final method of preventing the noise spike 1001 from being identified as a valid echo peak within the compression zone shown in FIG. 10 would be to make use of the alternate embodiment illustrated in FIG. 2B. In that case, the filter 208 could be used to remove the noise spike from the waveform data prior to the application of the PVE peak detection algorithm.

While each of these methods of removing the noise spike 1001 from the array of valid echo peaks would be successful, it falls to the requirements of the inspection application as to which would be the optimal solution. As such, all three methods have been included within the preferred embodiment of the PVE system of the present disclosure. Other embodiments, which comprise a PVE system using less than all of these methods—including a system which uses none of these methods—are also contemplated.

FIGS. 11A and 11B illustrate the compression zone overlap required when the PVE system of the present disclosure is used within a so-called compress on the fly system—that is, a system wherein the waveform data must be compressed and displayed as it is acquired. FIG. 11A shows a plurality of waveform data points spanning the boundary of two non-overlapping compression zones, A and B. Looking at the two compression zones together, it is obvious that point 1101 is a valid echo peak. However, as compression zone A is processed through the PVE peak detection algorithm—without the knowledge of the data points in compression zone B—a valid falling slope will not be found for data point 1101, and the algorithm will exit without identifying data point 1101 as a valid peak.

FIG. 11B shows the same group of data points as FIG. 11A, but this time the data points span overlapping compression zones. In this case, compression zone A will still fail to identify data point 1101 as a valid peak. However, compression zone B—which now contains the last two data points of compression zone A—will successfully identify data point 1101 as a valid echo peak, provided that UPVALID and DESAMPLE are set to values of one. For applications where UPSLOPE, DNSLOPE, and DESAMPLE require higher values, the compression zone overlap will need to be increased.

It can be appreciated by those skilled in the art that the present disclosure includes a user interface that allow users to input some options as herein disclosed, such as display mode, color of the peak values, compression ratios and the number of the peak values to be displayed in one compression zone. The user interface is preferably shared by the same user interface of an otherwise conventional NDT instrument. In addition the display can have a pointer that can be moved by the user via the user interface to highlight a spot, i.e., one of the peaks on the display. After the highlighted being activated, the full information about the peak point can be displayed, in predetermined formats. Examples of predetermined formats are replacing the entire display with the digital signal values flanking the signal peak, or providing such a display as an inset to the normal display, and the like Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A non-destructive inspection (NDI) instrument for testing an object, the instrument comprising:
   a transducer transmitting and receiving acoustic energy and converting the acoustic energy to electronic signals;
   at least one analog to digital converter for converting the electronic signals returned from the transducer into a series of digital signal values;
   at least one signal processor for processing and aggregating the digital signal values into groups of values associated with different compression zones and for identifying for each data group, a minimum value, a maximum value and, if available, at least one signal peak value;
   at least one display unit for producing and displaying graphical representations depicting information associated with the digital signal values and the minimum value, the maximum value, and the peak value;
   wherein the instrument including a facility which causes some of the digital data values at boundaries between compression zones to be shared by adjacent compression zones.

2. The instrument of claim 1, wherein the graphical representations are in the form of vertical lines which graphically depict on a coordinate system the minimum value, the maximum value, and the peak value.

3. The instrument of claim 1, wherein the peak value is shown as a highlighted data point or region on the graphical representations.

4. The instrument of claim 1, wherein the peak value is depicted by a color different from a color in which the graphical representation are rendered.

5. The instrument of claim 1, including depicting, relative to a single compression zone a plurality of signal peak values.

6. The instrument of claim 1, wherein only some of the peak values are selectively displayed for any compression zone.

7. The instrument of claim 1, including a user interface which includes a facility that allows a user to select from a plurality of display modes.

8. The instrument of claim 7, wherein the user interface allows the user to move a pointer on the display unit and to point and activate a first of the peak values on the display unit to display digital signal values associated with the first peak value with predetermined format.

9. The instrument of claim 8, including a facility which assures that the same peak values calculated for the digital data values at the boundaries are graphically displayed in only a single compression zone.

10. The instrument of claim 1, including a facility for specifying a minimum number of sequentially increasing or sequentially decreasing digital values required to indicate a valid rising or falling slope for determining peak values.

11. The instrument of claim 10, wherein alternate digital values are selected for creating the graphical representations.

12. The instrument of claim 1, including a facility for reducing sampling rate of a waveform data being processed.

13. The instrument of claim 1, wherein each compression zone is compressed at a predetermined compression ratio.

14. The instrument of claim 13, where the compression ratio is a ratio of 10:1 to 200:1.

15. The instrument of claim 1, including located in a housing and includes in the housing at least the analog to digital converter, the signal processor, the display unit and wherein the transducer is coupled to the housing by an electrical cable.

16. The instrument of claim 1 is located in a housing and includes in the housing at least the transducer, the analog to digital converter, the signal processor, the display unit.

17. The instrument of claim 1, wherein the signal processor further comprise at least one electronic signal filter for reducing the misidentification of the peak value.

18. The instrument of claim 1, wherein the signal processor further comprises at least one playback unit for storing and outputting electronic echo signals for later data processing.

19. A display method for a non-destructive inspection (NDI) instrument suitable for testing objects, the method comprising the steps of:
   operating a transducer to produce and receive acoustic energy and convert the acoustic energy to electronic signals;
   converting the electronic signals returned from the transducer into a series of digital signal values;
   aggregating the digital signal values into groups of values associated with different compression zones such that some digital values are shared between adjacent compression zones at boundaries thereof;
   identifying for each data group a minimum value, maximum value and, if available, at least one signal peak value; and
   producing graphical representations depicting information associated with the digital signal values, the minimum value, the maximum value and the peak value.

20. The method of claim 19, including showing the graphical representations on the display in the form of vertical lines which graphically depict on a coordinate system, the minimum value, the maximum value and the peak value.

21. The method of claim 19, including selectively depicting some of the peak values for a compression zone.

22. The method of claim 19, including specifying a minimum number of sequentially increasing or sequentially decreasing digital values required to indicate a valid rising or falling slope for determining peak values.

23. The method of claim 19, including processing less than all of the digital values in order to reduce processing time.

24. The method of claim 19, including compressing data relative to each compression zone at a predetermined compression ratio.

25. A non-destructive inspection (NDI) instrument for testing an object, the instrument comprising:
- a transducer transmitting and receiving acoustic energy and converting the acoustic energy to electronic signals;
- at least one analog to digital converter for converting the electronic signals returned from the transducer into a series of digital signal values;
- at least one signal processor for processing and aggregating the digital signal values into groups of values associated with different compression zones and for identifying for each data group, a minimum value, a maximum value and, if available, at least one signal peak value;
- at least one display unit for producing and displaying graphical representations depicting information associated with the digital signal values and the minimum value, the maximum value, and the peak value;
- a facility which assures that the same peak values calculated for the digital data values at the boundaries are graphically displayed in only a single compression zone;
- wherein the user interface allows the user to move a pointer on the display unit and to point and activate a first of the peak values on the display unit to display digital signal values associated with the first peak value with predetermined format.

* * * * *